United States Patent [19]

Hilliard et al.

[11] Patent Number: 5,384,458
[45] Date of Patent: Jan. 24, 1995

[54] PHOTONIC ELECTROMAGNETIC FIELD SENSOR FOR USE IN A MISSILE

[75] Inventors: Donald P. Hilliard, Oxnard; Dean L. Mensa, Ventura, both of Calif.

[73] Assignee: The United States of America as represented by the Secretary of the Navy, Washington, D.C.

[21] Appl. No.: 69,819

[22] Filed: Jun. 1, 1993

Related U.S. Application Data

[63] Continuation-in-part of Ser. No. 958,404, Sep. 30, 1992, Pat. No. 5,243,186.

[51] Int. Cl.6 .............................................. H01J 5/16
[52] U.S. Cl. ............................ 250/227.17; 343/911 L
[58] Field of Search .............. 250/225, 227.17, 227.21, 250/216; 324/96; 343/754, 761, 911 L; 342/6, 11

[56] References Cited

U.S. PATENT DOCUMENTS

| | | |
|---|---|---|
| 3,703,723 | 11/1972 | Albanese et al. ................ 343/911 L |
| 4,070,621 | 1/1978 | Bassen et al. . |
| 4,458,249 | 7/1984 | Valentino et al. ................... 343/754 |
| 4,728,554 | 3/1988 | Goldberg et al. . |
| 5,061,404 | 10/1991 | Wu et al. . |
| 5,134,421 | 7/1992 | Boyd et al. . |
| 5,173,699 | 12/1992 | Barr et al. . |

*Primary Examiner*—David C. Nelms
*Attorney, Agent, or Firm*—David Kalmbaugh; Melvin Sliwka

[57] ABSTRACT

An electromagnetic field sensor for use in a target seeking missile which measures the amplitude, phase, frequency and polarization of an incoming electromagnetic field as well as the angle of arrival of the incident electromagnetic field. A Luneberg lens is mounted in the radome of the missile. The Luneberg lens focuses an electromagnetic wave reflected from a target which then passes through the radome and enters the Luneberg lens on one side of the lens onto a point on the opposite side of the lens. A photonic sensor which may be a single electro-optic modulator or a pair of electro-optic modulators is positioned on the Luneberg lens at the point upon which the incident electromagnetic wave is focused. When a pair of electro-optic modulators are used as the sensor the sensing axis of one of the electro-optic modulators is generally perpendicular to the sensing axis of the other electro-optic modulator. Polarized light is provided to each electro-optic modulator of the sensor along an optical path which passes through the modulator. Each electro-optic modulator modulates the polarized light passing therethrough when the electro-optic modulator detects the incident electromagnetic wave. A photo-detector located along the optical path for each electro-optic modulator detects the modulated light as it exits from the electro-optic modulator.

18 Claims, 7 Drawing Sheets

PHOTONIC ELECTROMAGNETIC FIELD SENSOR FOR USE IN A MISSILE

This application is a continuation-in-part of copending U.S. patent application Ser. No. 07/958,404, filed Sept. 30, 1992, now U.S. Pat. No. 5,243,186.

BACKGROUND OF THE INVENTION

1. Field of the Invention

The present invention relates generally to electromagnetic field measuring devices and more particularly to an instrument which utilizes a Luneberg lens mounted in the radome of a missile for the measurement of an incident electromagnetic field.

2. Description of the Prior Art

There is currently a need in target seeking missiles for an electromagnetic field sensing apparatus which will accurately measure incoming electromagnetic wave fronts. Such an apparatus should have the capability of detecting incoming electromagnetic wave fronts such as radar/microwave signals as well as determining the angle of arrival of these incoming electromagnetic wave fronts without the scattering of the wave front which is normally associated with conventional electromagnetic field sensing apparatus such as metallic antennas. In addition, such an apparatus should have the capability of detecting the polarization of an incident electromagnetic field.

Target seeking missiles incorporating electromagnetic field sensors are also required to operate at high speeds. Aerodynamic considerations, in turn, generally require the use of an electrically transparent radome for enclosing the electromagnetic field sensor in a target seeking missile to provide protection of the sensor from meteorological events such as wind and water. In the case of military equipment, such as target seeking missiles, protection is also required from the concussive effects of nearby guns or the blast from near hits of an exploding projectile.

Target signals passing through a radome will be incident on the inside surface of the radome inner wall or bulkhead of the missile resulting in a substantial portion of the incident energy being reflected by the bulkhead. The reflected signal will probably intercept the antenna which results in the antenna receiving the incoming electromagnetic field energy as well as the reflection of this electromagnetic field. A wide beam-width antenna, which is generally preferred in tracking systems for target seeking missiles, will detect both incoming and reflected electromagnetic energy and the resulting interference between them will lead to a severe degradation of the radiation patterns. This, in turn, results in the tracking system of the missile being unable to effectively locate and destroy enemy targets.

U. S. Pat. No. 5,173,699 which issued Dec. 22, 1992 to Barr et. al. partially solves this problem of direct reflection from the internal wall of the missile radome by utilizing a radome inner wall fitted with surface wave absorbent material. In addition, the remaining space between the antenna, which is metallic, and the radome is at least partially filled with radar absorbent material so as to at least partially suppress radar signals reaching the antenna by other than a direct path through the radome.

While partially reducing the effects of reflected radiation, metallic antenna, such as the antenna of U.S. Pat. No. 5,173,699 develop surface currents which are induced by incident electromagnetic fields being sensed, thereby creating scattered electromagnetic fields. These scattered electromagnetic fields disturb the incident electromagnetic fields being sensed reducing the accuracy of the electromagnetic field measurements. Further these scattered electromagnetic fields provide a signature for enemy detectors in a hostile environment. Further, the transmission lines for these metallic antenna enhance the above problems in that the transmission lines are also metallic.

The antenna assembly used by target tracking missiles generally comprises pairs of antenna elements for tracking a target in azimuth and elevation and generally referred to as monoplause tracking radar. As a result of degradation of the types discussed above the tracking response of a pair of antenna for a monoplause tracking radar will suffer perturbation to the desired monotonic (within the operating field of view), and approximately linear, difference characteristic. Minor perturbations are manifested as ripples on the tracking response which cause a localized tracking error; major perturbations result in a reversal of the tracking curve (difference characteristic) and lead to ambiguous target bearing information.

A need therefore exists for a tracking radar for use in a target seeking missile which provides a long-sought solution to the problem of accurately tracking a target by, for example, determining the angle of arrival of an incoming electromagnetic wave reflected from the target.

SUMMARY OF THE INVENTION

The purpose of the present invention is to provide an electromagnetic field sensor which may be used as a tracking radar for a missile or the like and which has the capability of measuring the amplitude, phase, frequency and polarization of an incoming electromagnetic field as well as the angle of arrival of the incident electromagnetic field. The present invention comprises a Luneberg lens which is mounted in the radome of a target seeking missile and which functions as the tracking radar for the missile. An incoming electromagnetic wave reflected from a target passes through the radome entering the Luneberg lens on one side of the lens. The incoming electromagnetic wave is then focused to a point on the opposite side of the Luneberg lens.

A sensor which may comprise either one electro-optic modulator or a pair of electro-optic modulators is positioned on the Luneberg lens at the point upon which the incident electromagnetic wave is focused. When a pair of electro-optic modulators are used as the sensor the sensing axis of one of the electro-optic modulators is generally perpendicular to the sensing axis of the other electro-optic modulator.

Polarized light is provided to each electro-optic modulator of the sensor along an optical path which passes through the modulator. Each electro-optic modulator modulates the polarized light passing therethrough when the electro-optic modulator detects the incident electromagnetic wave. A photo-detector located along the optical path for each electro-optic modulator detects the modulated light as it exits from the modulator. In this manner incident electromagnetic fields may be detected and measured without having scattered fields effect the measurement due to the lack of a metallic antenna and metallic wires/conductors which are normally attached to the metallic antenna in conventional tracking radar.

In the present invention multiple sensors may be positioned on the outer surface of the Luneberg lens to allow for the measurement of the amplitude, phase, angle of arrival, frequency and polarization of an incoming electromagnetic wave. In the present invention, the electro-optic modulators may be fabricated from second order nonlinear optical polymers which exhibit low dielectric constants thereby reducing perturbations to the incident electromagnetic wave.

It is therefore an object of the invention to provide a non-metallic tracking radar for use with a missile.

It is a further object of the invention to provide a tracking radar with enhanced performance characteristics which will lead to non-ambiguous target bearing information.

It is another object of the invention to provide a tracking radar which measures the angle of arrival of an incident electromagnetic field (reflected from a target) over a wide field of view.

It is yet another object of the invention to monitor an incoming electromagnetic field (reflected from a target) while causing negligible scattering of the fields being monitored.

Still further objects, advantages and novel features of the present invention will become apparent from the following detailed description of the invention when considered in conjunction with the drawings.

DETAILED DESCRIPTION OF THE PREFERRED EMBODIMENT

The preferred embodiment of the present invention will now be discussed in conjunction with all of the figures of the drawings.

Figure 1:
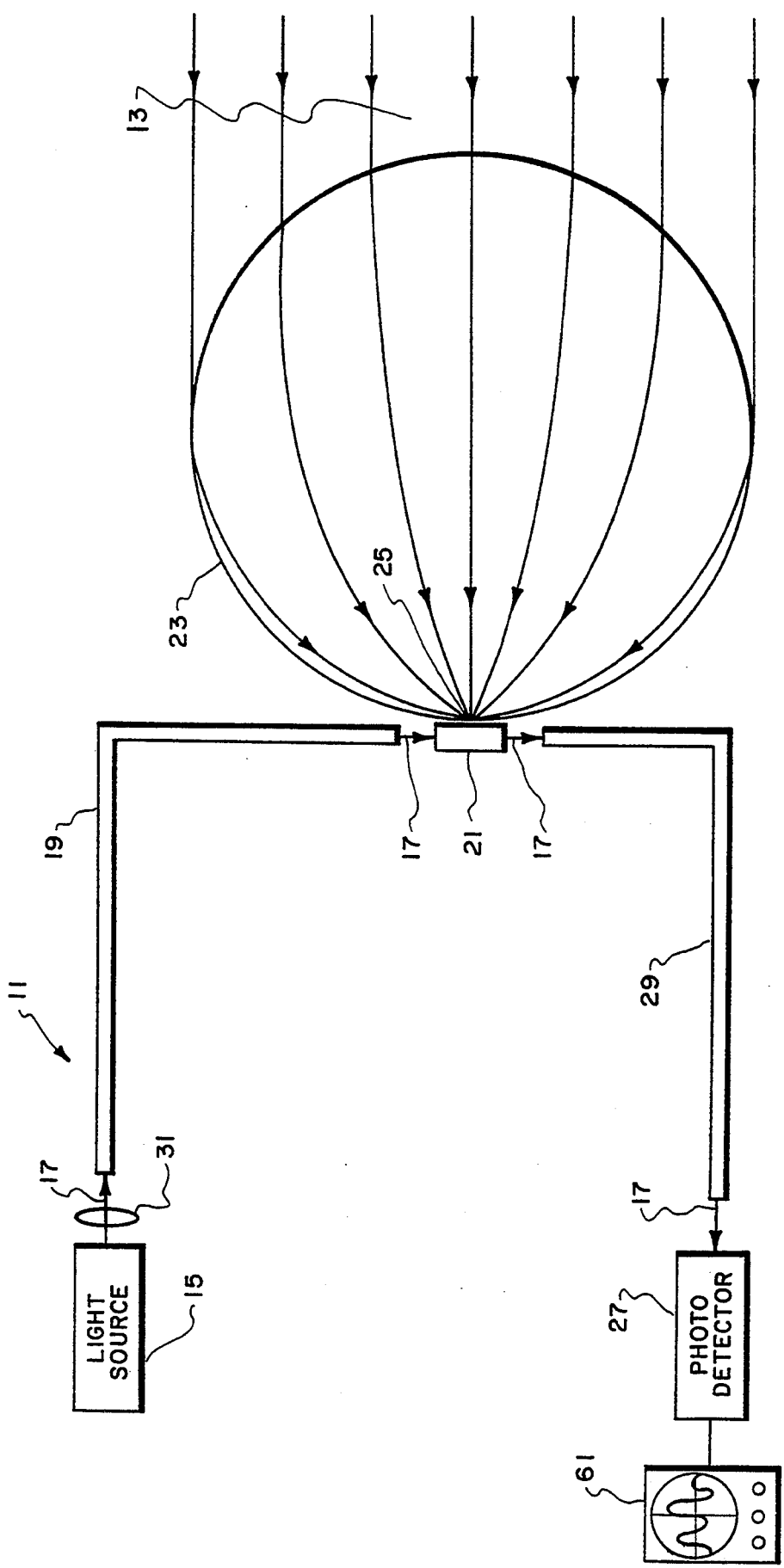
FIG. 1 is a schematic view illustrating the basic elements of the photonic electromagnetic field sensor apparatus constituting the present invention.

Referring now to all of the drawings and in particular to FIGS. 1, 9A, 9B and 10, the basic elements necessary for the operation of the present invention are illustrated therein. FIG. 1 shows a photonic electromagnetic field sensor apparatus 11 in free space which operates with negligible perturbation upon an incident electromagnetic field 13 which may be a planar or spherical wave front and may be elliptically, circularly or linearly polarized. The apparatus 11 of the present invention comprises a light source 15 positioned along an optical path 17 for transmitting a monochromatic beam of laser light along optical path 17 through a polarization maintaining optical fiber 19 to a photonic sensor 21. Photonic sensor 21 is positioned on the outer surface of Luneberg lens 23 at a focal point 25 and will modulate light entering the sensor 21 along optical path 17 when electromagnetic field 13 is incident on sensor 21 at point 25. Photonic sensor 21 may be a Pockel cell which is an electro-optic material having the property of variable birefringence.

Figure 9A:
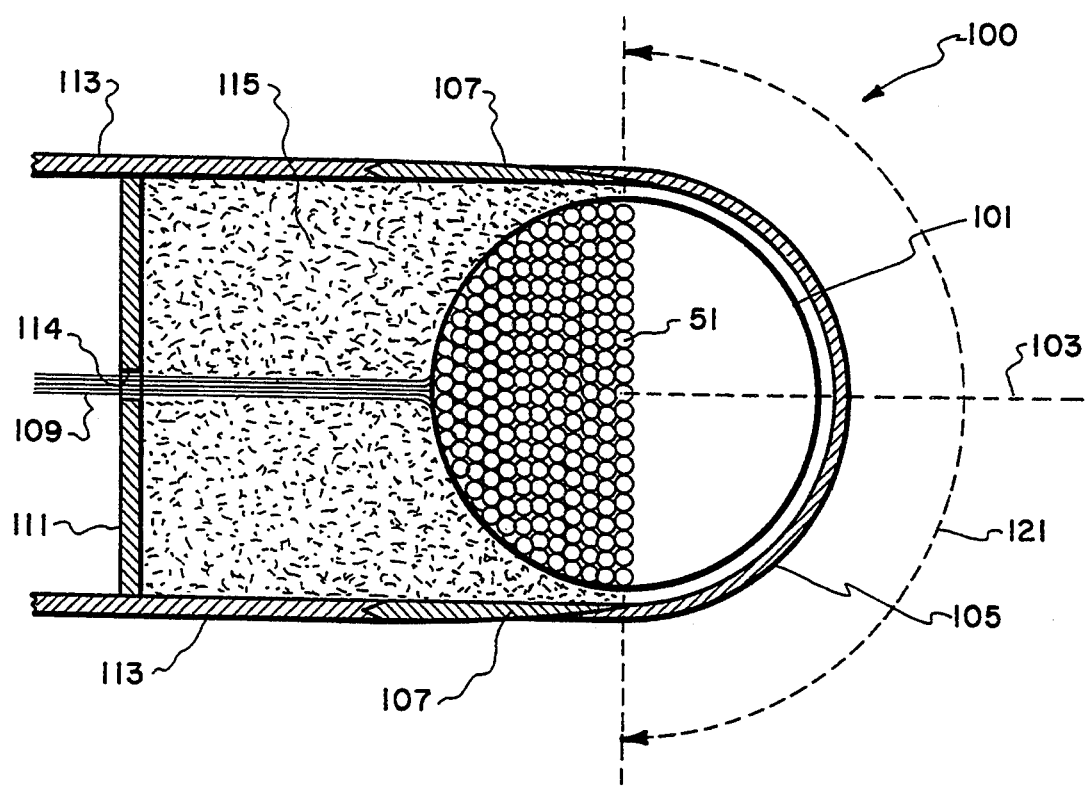
FIG. 9A and 9B are sectional views of the photonic electromagnetic field sensor of the present invention having first and second field of views.
Figure 9B:
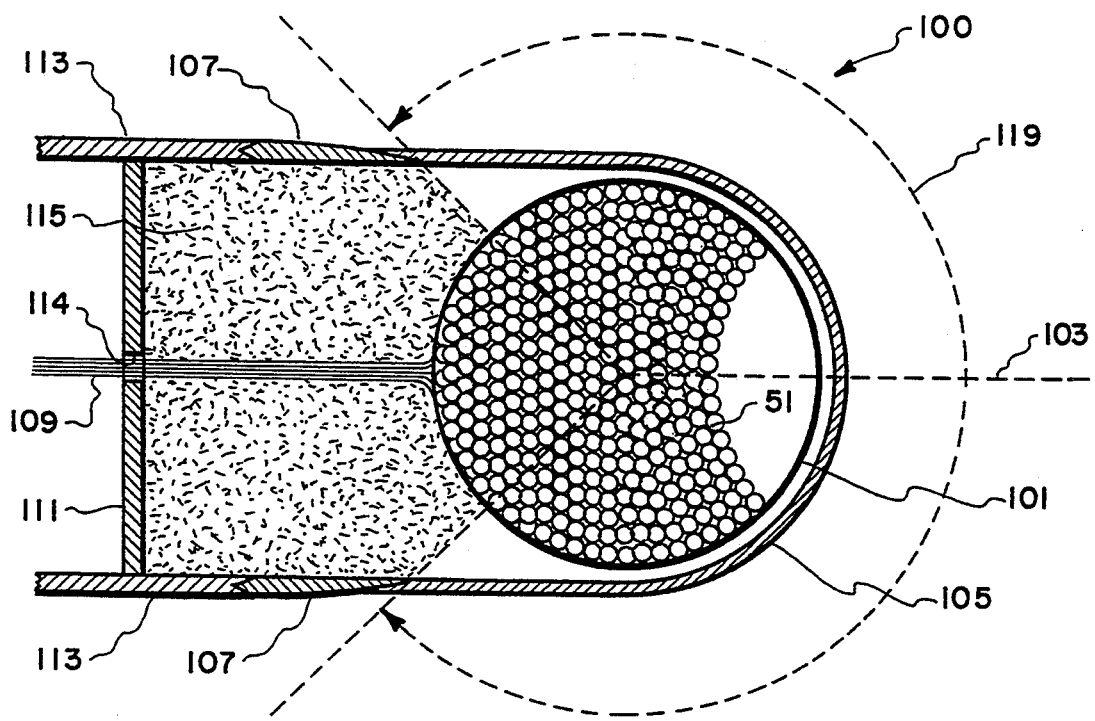

As shown in FIGS. 9A and 9B, a Luneberg lens 101 is mounted in a radome 105 with radome 105 forming the forward end of a target seeking missile 100. The radome 105 illustrated in FIGS. 9A and 9B is contoured to follow the shape of Luneberg lens 101, that is the radome approximates a dome shaped structure. The radome may be fabricated from any well known composite material having low dielectric constants and loss tangents at radar and microwave frequencies of the electromagnetic spectrum and in particular at the X band frequency range of 8–12 GHz which is generally the frequency range used by target seeking missiles. Examples of materials that are suitable for the fabrication of radomes may found in U.S. Pat. No. 5,134,421 to Boyd et. al. which issued Jul. 28, 1992.

The Luneberg lens illustrated in FIG. 9A has a plurality of photonic sensors 51 uniformly distributed around the missile boresight 103 in the rear portion of the Luneberg lens 101 in a hemispherical manner. This hemispherical distribution of photonic sensors 51 on Luneberg lens 101, in turn, provides for field of a view 121 of one hundred eighty degrees allowing Luneberg lens 101 to focus an incoming electromagnetic wave reflected from a target, not illustrated, onto one the plurality of sensors positioned on the rear portion of Luneberg lens 101.

Figure 3A:
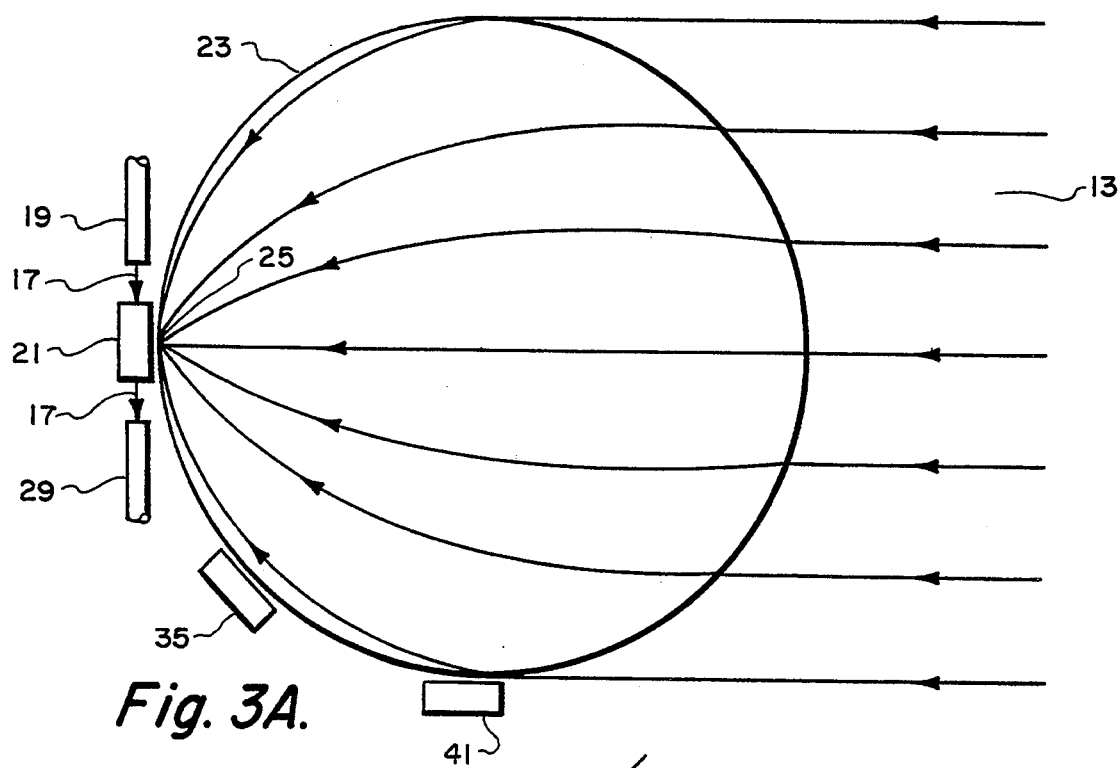
FIGS. 3A and 3B illustrate electromagnetic wave fronts incident on the Luneberg lens of the present invention at different angles of arrival.
Figure 3B:
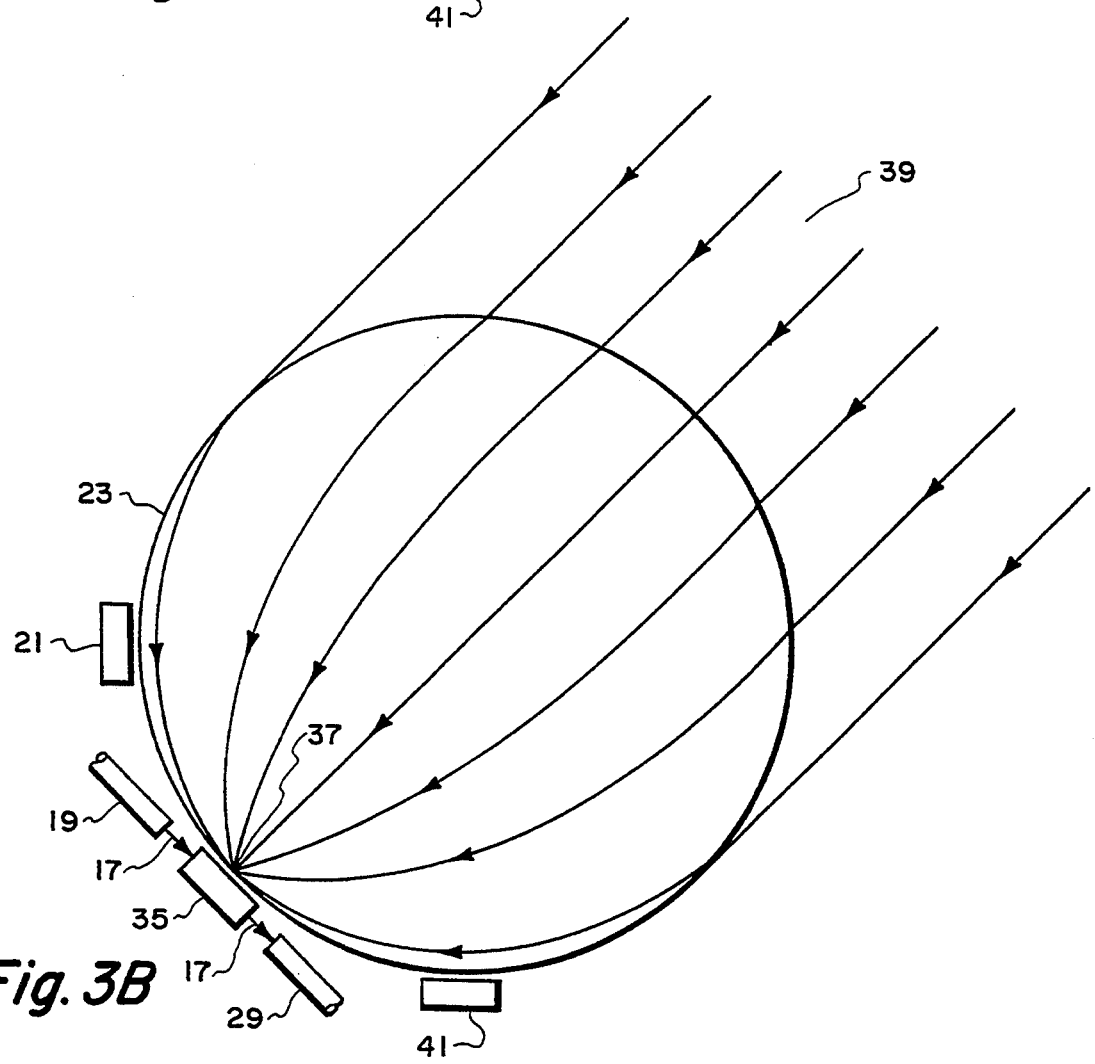

Referring to FIGS. 3A, 3B and 9A when the target is positioned on missile boresight 103 forward of target seeking missile 100, Luneberg lens 101 (identified as lens 23 in FIGS. 3A and 3B) focuses an incoming electromagnetic wave 13 on photonic sensor 21 which is positioned on the outer surface of lens 23 at the focal point 25 of incoming electromagnetic wave 13. Focal point 25 is aligned with missile boresight 103. Application of electromagnetic wave 13 to sensor 21 modulates laser light propagating through sensor 21 along optical path 17 with the degree of modulation of the laser light being in direct proportion to wave 13 and thus the strength of wave 13 which is measured by a photo-detector 27, FIG. 1. Further, since Luneberg lens 101 focuses the incoming electromagnetic wave 13 on one focal point 25 and thus one sensor 21, the angle of arrival of the incoming electromagnetic wave 13 and the direction of the target may easily be determined by measuring the modulation of laser light passing through sensor 21.

Referring to FIGS. 3A and 3B, in a like manner, a photonic sensor 35 positioned on the outer surface of Luneberg lens 23 at a focal point 37 which is approximately forty five degrees in a counterclockwise direction from sensor 21 and missile boresight 103, FIG. 9A. An electromagnetic wave 39 reflected from a target and incident upon Luneberg lens 23 at angle of forty five degrees from the missile boresight 103, FIG. 9A, will be focused on sensor 35 as is best illustrated by FIG. 3B with sensor 35 modulating laser light propagating therethrough so that a second photo-detector, not illustrated, may measure the strength of electromagnetic wave 39 and the angle of arrival of electromagnetic wave 39 thereby indicating the position of the target relative to the missile boresight 103, FIG. 9A. A third photonic sensor 41 is shown in FIG. 3 on the outer surface of Luneberg lens 23 ninety degrees from missile boresight 103, FIG. 9A. Sensor 41 will, in turn, allow photonic electromagnetic field sensor apparatus 11 to measure the strength/intensity and the angle of arrival of an electromagnetic wave incident on Luneberg lens 23 ninety degrees from missile boresight 103, FIG. 9A, thus indicating the direction of the target missile 100 is tracking. It should be understood that each sensor 51 (21, 35 and 41 as illustrated in FIGS. 3A and 3B) has a separate measuring device, that is a separate photo-detector, for measuring the strength/intensity of an incoming electromagnetic field, thus allowing photonic electromagnetic field sensor apparatus 11 to distinguish between different electromagnetic wave fronts within the field of view 121 of missile 100, FIG. 9A, and the field of view 119 of FIG. 9B.

The field of view 119 illustrated in FIG. 9B is approximately two hundred seventy degrees allowing missile 100 to sense targets which are one hundred thirty five degrees in either clockwise direction or a counterclockwise direction from boresight 103. Sensors 51 are positioned on approximately three quarters of the outer surface of Luneberg lens 101 to allow one of the sensors 51 on Luneberg lens 101 to detect and thereby determine the angle of arrival of any incoming electromagnetic wave within field of view 119. It should be noted radome 105, as illustrated in FIG. 9B, is extended to allow for allow for a field of view of two hundred seventy degrees.

Referring to FIG. 9A, there is located between the bulkhead 111 and the rear portion of Luneberg lens 101 a radar absorbing material 115 which will absorb electromagnetic energy passing through Luneberg lens 101 toward bulkhead 111. The absorption of electromagnetic energy by radar absorbing material 115 substantially suppresses radar/microwave signals reaching the Luneberg lens 101 by other than a direct path through the radome 105, that is the radar absorbing material substantially prevents reflections from bulkhead 111 and the inner surface of outer wall 113 of missile 100 from reaching the sensors 51 of Luneberg lens 101.

The use of radar absorbing materials is well known in the prior art. The radar absorbing material 115 may be a resistive sheet of porous material impregnated with graphite and spaced a quarter-wavelength off a metallic backing plane, often referred to as a Salisbury screen. Other examples of radar absorbing materials include bulk materials loaded with carbon such as carbon fused in a matrix of spongy urethane foam or by spreading a thin coating of carbon on the fibers of a fibrous mat. U.S. Pat. No. 4,728,554 which issued Mar. 1, 1988 to Goldberg et. al. illustrates examples of flexible woven fabrics having reduced reflectivity to incident linearly polarized electromagnetic radiation in the microwave frequency range.

There is positioned between outer wall 113 and radome 105 a cylindrical shaped resistive sheet 107 fabricated from a dielectric material which reduces radar reflections from incoming electromagnetic waves. It should be noted that resistive sheet 107 and radar absorbing material 115 both function to absorb electromagnetic energy not passing directly through radome 105 to Luneberg lens 105.

Figure 10:
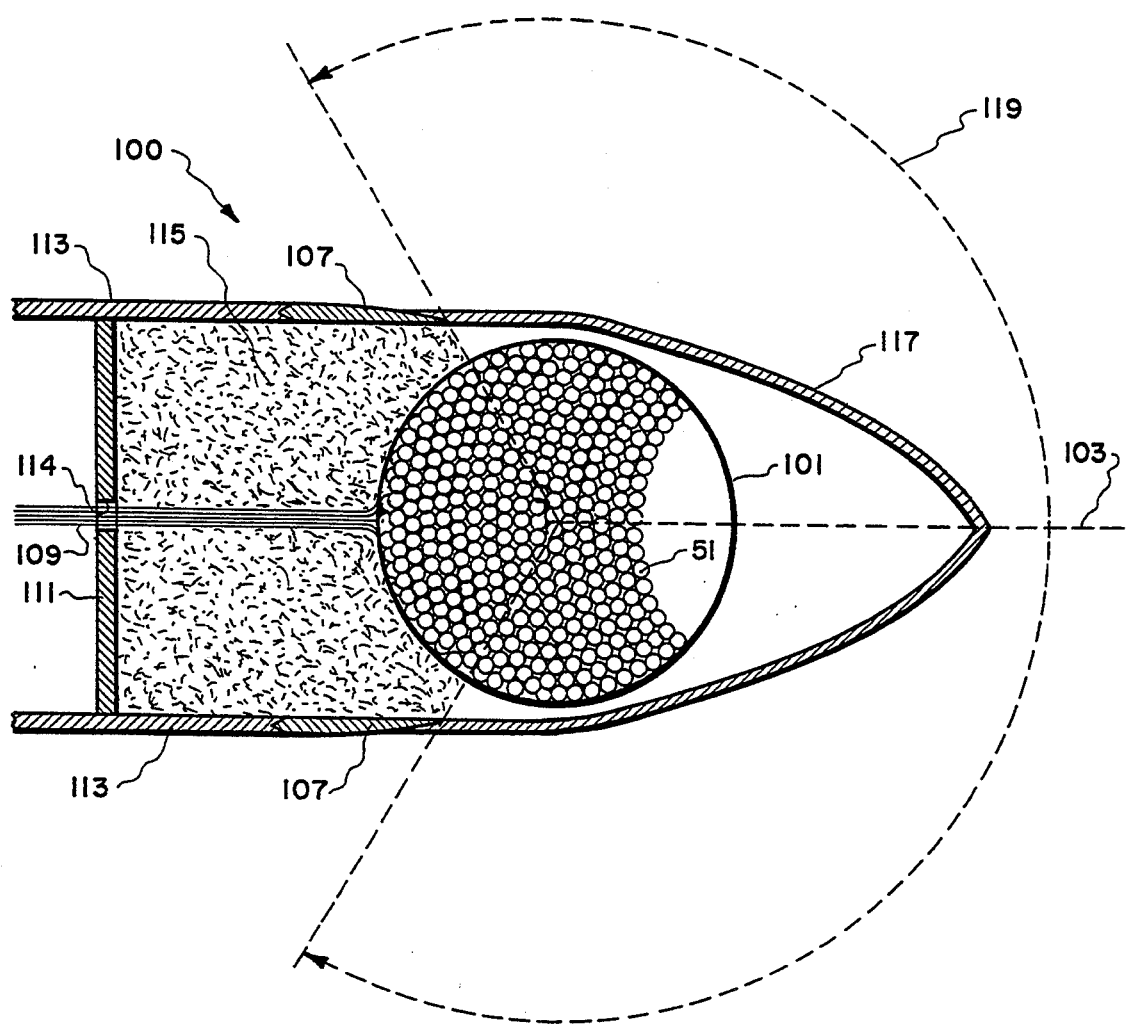
FIG. 10 is a sectional view of the photonic electromagnetic field sensor of the present invention having a field of view of two hundred seventy degrees and using a radome with an acutely pointed profile.

As is best illustrated by FIG. 10 the radome 117 utilized by missile 100 may have acutely pointed profile which is suitable for the high speed operation of a target seeking missile. The field of view 119 for the Luneberg lens 101 illustrated in FIG. 10 is one hundred thirty five degrees in a clockwise direction from boresight 103 and one hundred thirty five degrees in a counterclockwise direction from boresight 103.

Figure 4A:
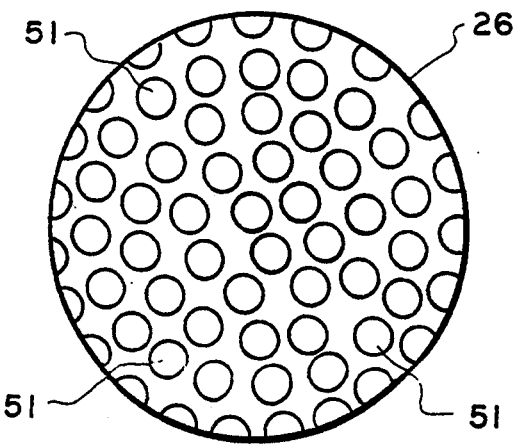
FIGS. 4A through 4C illustrate a Luneberg lens having a plurality of photonic sensors.
Figure 4B:
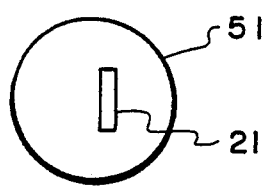

Referring FIGS. 4B, 4C, 9A and 9B, photonic sensors 51 may be positioned at a plurality of locations on the outer hemispherical surface of a Luneberg lens 101 (illustrated as Luneberg lens 26 in FIG. 4) to measure the intensity of any electromagnetic wave passing through radome 105 and then being incident upon Luneberg lens 101 irregardless of the angle of arrival of the wave. In addition, by positioning photonic sensors 51 on the outer surface of Luneberg lens 101 in the manner illustrated in FIGS. 9A and 9B, the angle of arrival of any incoming electromagnetic wave may be measured since Luneberg lens 101 will focus the incoming wave on a particular focal point thereby focusing the wave on the photonic sensor positioned at that particular focal point. For example, the Luneberg lens of the present invention will focus an electromagnetic wave 39 arriving at an angle of forty five degrees on photonic sensor 35, FIG. 3B which will, in turn, result in only laser light propagating through sensor 35 being modulated by sensor 35. By utilizing a photodiode 57 of the type illustrated in FIG. 5 for receiving the modulated light signal from sensor 35 photo-detector 27 provides at its output an electrical signal having an amplitude that varies as function of the amplitude and phase of the incident wave 39. The angle of arrival of wave 39 may be then determined directly by noting the response of the corresponding photo-detector measuring light modulated by sensor 35.

Figure 4C:
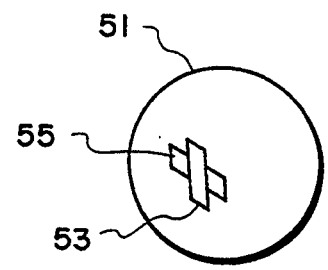

Referring again to FIGS. 4B, 4C, 9A and 9B, Luneberg lens 101 has a plurality of photonic sensor elements 51 which may be a conventional photonic sensor 21 as is best illustrated in FIG. 1 and FIG. 4(B), or a photonic sensor having large electro-optic coefficients in the two axis that are tangent to the surface of the lens, or two separate single photonic sensors 53 and 55 with large electro-optic coefficients in a single axis positioned orthogonal to each other and tangent to the surface of the Luneberg lens . The large electro-optic coefficients for each photonic sensor 53 and 55 is the sensing axis for the photonic sensor. Thus, the sensing axis for photonic sensor 53 which is the Y axis is perpendicular to the sensing axis for photonic sensor 55 which is the X axis. As is best illustrated by FIG. 4C, either configuration will enable the sensing of any arbitrarily polarized electromagnetic field incident on the Luneberg lens. The specific polarization of the incident electromagnetic field may be determined by means of a conventional polarization analyzer apparatus, not shown, or by the circuit illustrated in FIG. 6.

Referring again to FIG. 1, there is positioned along optical path 17 down stream from sensor 21 photo-detector 27. Photo-detector 27 detects the modulated light as it traverses sensor 21 and then exits from sensor 21 to photo-detector 27 through an optical fiber 29 positioned on path 17. In operation photonic sensor 21 detects weak electromagnetic fields while imposing a negligible perturbation thereon.

Also shown in FIG. 1 is a polarizer 31 located along optical path 17 between the light source 15 and the polarization maintaining optical fiber 19. Polarizer 31 polarizes the light provided by source 15 and then transmitted through fiber 19 to sensor 21.

Figure 5:
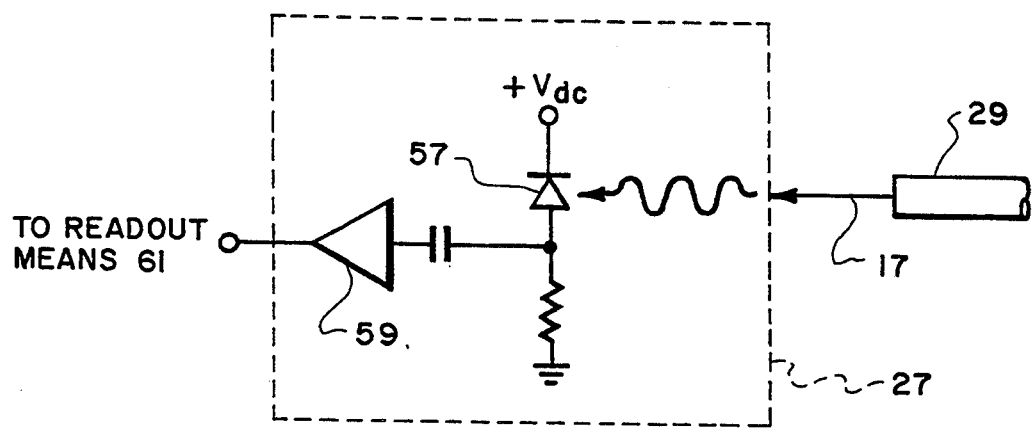
FIG. 5 is an electrical schematic diagram for the photo-detector used in the preferred embodiment of the present invention.

Referring to FIGS. 9 and 10 it should be noted that the polarization maintaining optical fiber 19, FIG. 1, and the optical fiber 29, FIG. 1, for each of the sensors 51 on Luneberg lens 101 is included in a fiber optic bundle 109 connecting the missile light source 15, FIG. 1, and the light detecting elements 27, FIG. 5, to the sensors 51 on Luneberg lens 101. It should further be noted the missile light source 15 and light detecting elements 27 are located in the rear portion of the missile which requires the placement of an aperture 114 in the bulkhead 111 allowing fiber optic bundle 109 to pass through bulkhead 111.

Referring to FIG. 1, the light source 15 used in the preferred embodiment of the present invention may be any conventional light source, but preferably is a source of monochromatic laser light having a wavelength of approximately 1.3 microns so that the monochromatic laser light may be transmitted through polarization maintaining optical fiber 19 which efficiently transmits light having a wavelength of approximately 1.3 microns. A preferred light source is a Neodymium YAG laser which operates at a wavelength of 1.32 microns and is manufactured by Schwartz Electro-Optics Inc. of Orlando, Fla.

The theory of electro-optic modulation has been extensively discussed in the literature, for example F. S. Chen, "Modulators for Optical Communications", proceedings of the IEEE, Vol. 58 No. 10, October 1970, pages 1440–1457 and "Optical Waves in Crystals, Propagation and Control of Laser Radiation" by Amnon Yariv and Pochi Yeh. The literature discusses the electro-optic properties of a number of different materials and modulator configurations employing electro-optic modulators. Suitable electro-optic materials for the composition of photonic sensor 21 may be selected from the group consisting of crystals such as $LiNbO_3$, $LiTaO_3$, $KD_2PO_4(DKDP)$, $Ba_2NaNb_5O_{15}$, $Sr_{0.25}Ba_{0.75}Nb_2O_6$ and $BaTiO_3$.

Photonic sensor 21 may also be fabricated from second order nonlinear optical polymer materials, called an electro-optic polymer, which have response times in picoseconds and very low index amplitude modulation requirements of less than ten and greater than minus two. Further, the dielectric constant exhibited by these second order nonlinear optical polymers is generally less than 3.5 as opposed to conventional inorganic electro-optic materials which have dielectric constants greater than 35. Electro-optic polymers include those manufactured by Dupont and Hoest Celanese Corporation. Preferred electro-optic polymers for fabricating photonic sensor 21 may be, for example, methyl nitro aniline or polymethylmethacrylate. In addition, several electro-optic polymers which may be used to fabricate photonic sensor 21 are disclosed in U.S. Pat. No. 5,061,404, issued Oct. 29, 1991, to Chengjiu Wu et. al.

Photonic sensors exhibit a property identified as Pockel's linear electro-optic effect which means that the index of refraction of electro-optic materials such as lithium niobite, lithium tantalate and polymethylmethacrylate changes proportionally to the strength of an electric field being measured with this change being generally exhibited over a frequency range of from 1 hertz to 1000 GHz. The response of these materials to the electric field being measured is directly proportional to a factor known as the electro-optic coefficient which has the units of meters/volt. The electro-optic coefficient is a tensor quantity and is typically, but not always, large in the direction of one axis of the electro-optic material and weak in the remaining two axis of the material. When laser light is passed through the electro-optic material it is modulated by the changing index of refraction of the material in proportion to the strength/intensity of the electric field being measured. The laser light passing through the electro-optic material may then be measured by detector means such as photo-detector 27.

These electro-optic materials also have the common property that they enter a state of variable birefringence which is proportional to the magnitude of the field strength imposed across the material. When polarized laser light propagates through the material, it undergoes a rotation in the direction of polarization which is proportional to the distance traversed in the material and the magnitude of the birefringent state. By polarizing laser light prior to entry into a electro-optic material and analyzing the polarized laser light after the light propagates through the material and undergoes a rotation of its polarization direction, by means of a polarizing analyzer apparatus, the extent of the rotation of the plane of polarization due the birefringent state can be measured. This phenomenon, known as the Pockels effect, is well known in the literature. In addition, the use of a polarizing analyzer apparatus to measure the extent of rotation of the plane of polarization after polarized laser light propagates through an electro-optic crystal is thoroughly discussed in U.S. Pat. No. 4,070,621, issued Jan. 24, 1978 to Howard I. Bassen and Richard Peterson. U.S. Pat. No. 4,070,621 also discloses signal processing circuitry which may be used with a photo-detector, such as photo-detector 27, and which will measure the amplitude, phase and frequency of an incident electromagnetic field.

Figure 2:
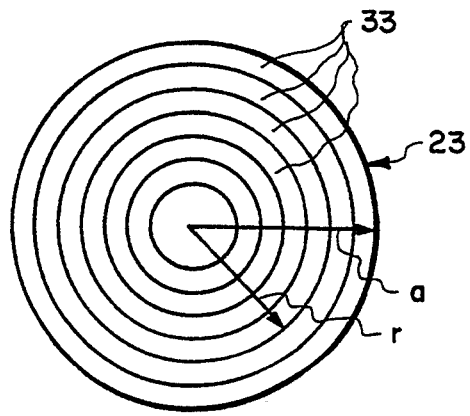
FIG. 2 is a schematic view illustrating the Luneberg lens used in the preferred embodiment of the present invention.

Referring now to FIG. 2, there is shown a Luneberg lens 23 which may be used as the Luneberg lens of the present invention. The Luneberg lens is fabricated by stacking concentric shells 33 of polystyrene material with the dielectric constant of each shell 33 given by the following expression:

$$\epsilon_r[r] = 2 - [r/a]^3 \quad (1)$$

where a is the radius of the lens, r is the radial distance from the center of the lens, and $\epsilon_r[r]$ is the relative permittivity of Luneberg Lens 23 which varies as a function of distance from the center of the lens having a maximum value of two at the center of the lens and a minimum value of one at the radius a of lens 23. Because of the low permittivity of polystyrene, the Luneberg lens 23 used in the preferred embodiment of the present invention will not generate scattered electromagnetic fields which limits the accuracy of the measurements provided by photonic electromagnetic field sensor apparatus 11.

Referring now to FIG. 5, there is shown an electrical schematic of photo-detector 27 which includes a photo-diode 57 for receiving the modulated laser light from sensor 21 and providing an electrical signal in response to the modulated light signal having an amplitude that varies in response to the degree of modulation of the laser light by sensor 21. The electrical signal is then amplified by a low noise amplifier 59 and supplied to conventional readout means 61 such as an oscilloscope which provides a visual indication of the amplitude, phase, and frequency of the incoming electromagnetic wave 13. In addition, it should be noted that the output of amplifier 59 may be supplied to the missile's on board computer for processing and, in particular, for determining the angle of arrival of incident electromagnetic waves reflected by the target that the missile is tracking. This, in turn, allows the missile to accurately track the target the missile is seeking to home in on and destroy.

Figure 6:
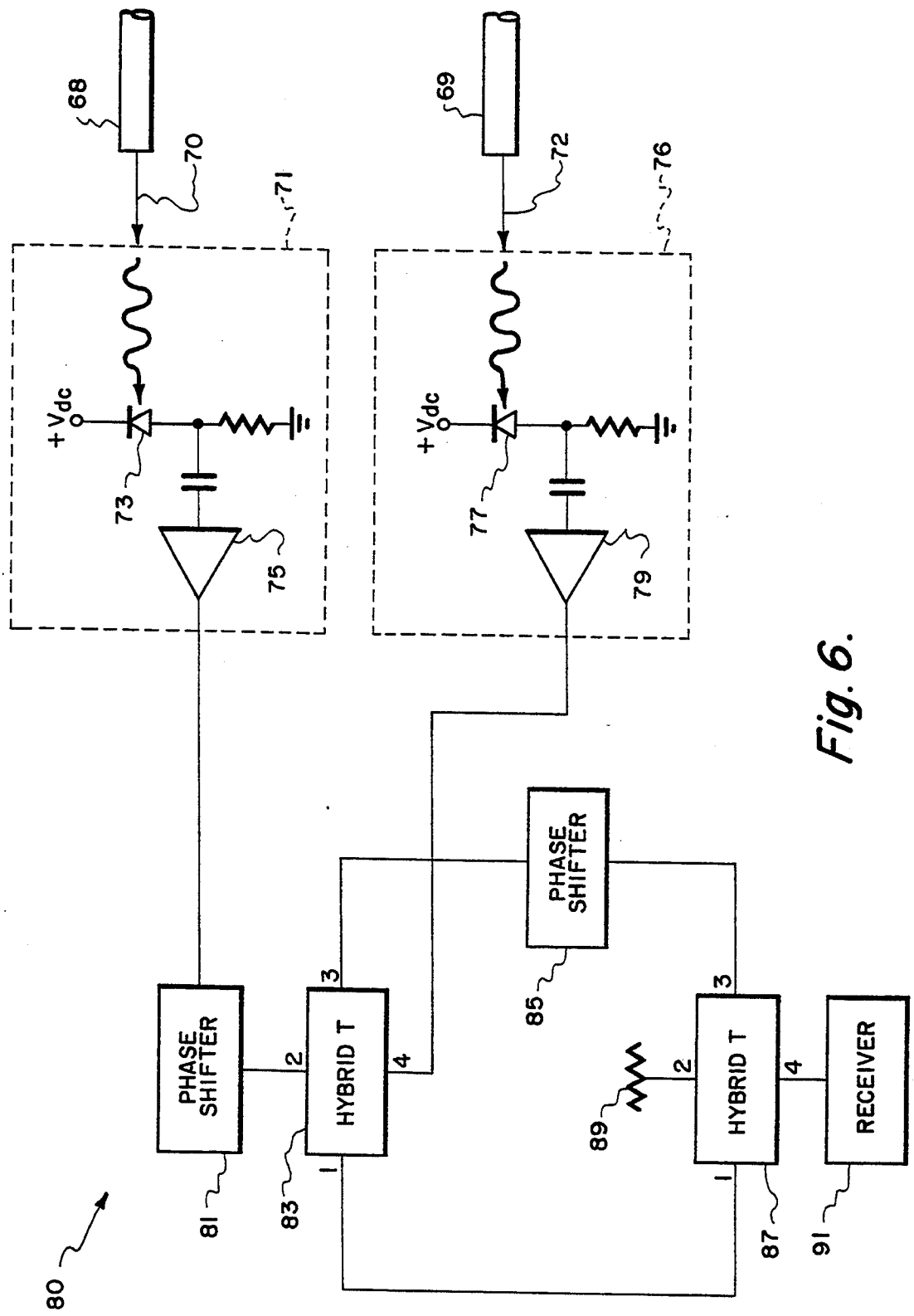
FIG. 6 is an electrical schematic diagram of the power combiner and divider circuit which in combination with a network analyzer is utilized to measure the polarization of an incident electromagnetic wave.

Referring to FIGS. 4C and 6, when an electromagnetic wave is focused by Luneberg lens 23 on photonic sensors 53 and 55, modulated light from sensor 53 is transmitted through optical fiber 68 along optical path 70 to photo-detector 73, while modulated light from sensor 55 is transmitted through optical fiber 69 along optical path 72 to photo-detector 77. The degree of modulation of light exiting sensors 53 and 55 will vary depending upon the polarization the incident electromagnetic wave detected by sensors 53 and 55.

Figure 7A:
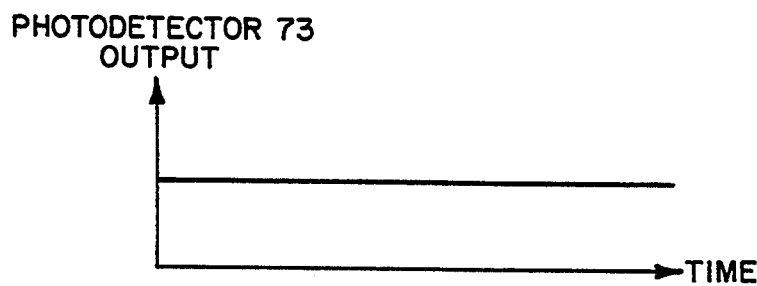
FIGS. 7A and 7B illustrates representative waveforms provided at the output of the photo-detectors used with the circuit of FIG. 6 to determine the polarization of an incident electromagnetic wave.
Figure 7B:
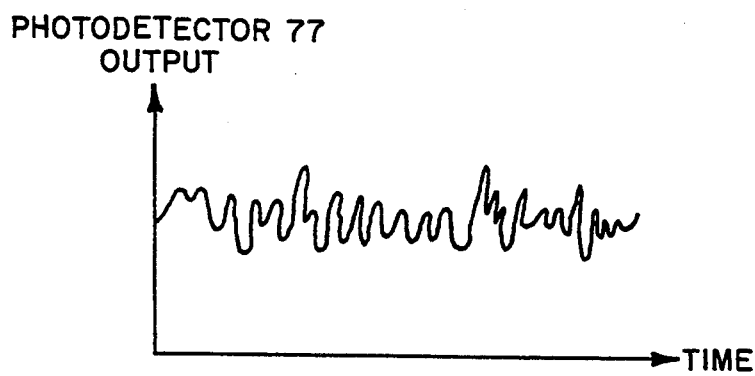

Thus, for example, when the electric field vector of an incoming electromagnetic wave is in a horizontal plane, the degree of modulation of light exiting sensor 55 is maximum, while light exiting sensor 53 is not modulated. Photo-detector 77 which detects modulated light from sensor 55 will provide at its output the modulated electrical signal of FIG. 7B, while the photo-detector 73 which detects modulated light from sensor 53 will provide at its output the direct current voltage signal of FIG. 7A. The signals of FIG. 7A and FIG. 7B are amplified respectively by low noise amplifiers 75 and 79 and then provided to power combiner and divider circuit 80 which in combination with a receiver/network analyzer 91 may be utilized to measure the polarization of the incident electromagnetic wave.

The signals occurring at the outputs of low noise amplifiers 75 and 79 may also be supplied to readout means 61. Readout means 61 may be, for example, a conventional two channel oscilloscope which provides an observer with a visual indication of the amplitude, phase and frequency of the incoming electromagnetic wave or a target seeking missile's on board computer which allows the computer to calculate the amplitude, phase, frequency and angle of arrival of any incoming electromagnetic wave reflected from a target.

Figure 8:
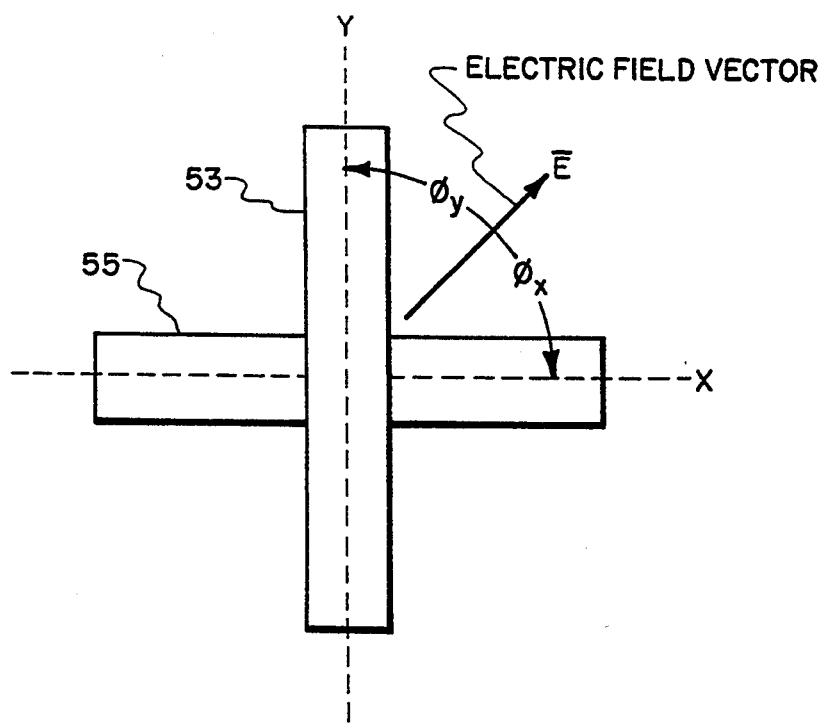
FIG. 8 illustrates the electric field vector for an incident electromagnetic wave whose polarization is being measured by the present invention.

Referring to FIGS. 4C, 6 and 8, the electrical signal outputs of amplifiers 75 and 77 may be described by the amplitude and phase angle components of the electric field vector of an incident electromagnetic wave E detected by photonic sensors 53 and 55. The amplitude component of the electrical signal provided at the output of amplifier 75 represents the amplitude of the Y axis component of the electric field vector E, as shown in FIG. 8, and is designated by the reference letter a. Similarly, the amplitude component of the electrical signal provided at the output of amplifier 77 represents the amplitude of the X axis component of the electric field vector E and is designated by the reference letter b. As shown in FIG. 8, the phase angle between the electric field vector E and the Y axis (sensing axis of photonic sensor 53) is represented by the reference symbol $\phi_y$, while the phase angle between the electric field vector E and the X axis (sensing axis of photonic sensor 55) is represented by the reference symbol $\phi_x$. The polarization of the electric field vector E may be described completely by the phase difference $\phi$ between the x and y phase angle components of vector E, that is $\phi = \phi_y - \phi_x$ and the magnitude ratio b/a.

The power combiner and divider circuit 80 of FIG. 6 may be used to calculate the polarization of incident electromagnetic wave when phase shifters 81 and 85 are calibrated. When incoming power is directed to output port four of hybrid tee 87, the phase difference $\phi$ and the magnitude ratio b/a are given by the following expressions:

$$\phi = \frac{\pi}{2} - \alpha \qquad (1)$$

$$\frac{b}{a} = -\tan\frac{\beta + \pi}{2} \qquad (2)$$

where $-\alpha$ is the phase shift of phase shifter 81 and $-\beta$ is the phase shift of phase shifter 85.

The power output component, designated by the letter s, of the electrical signal provided at port four of hybrid tee 87 is supplied to receiver 91 and may be defined by the following expression:

$$s = e^{-j\alpha}(a+jb) \qquad (3)$$

where $e^{j\alpha}$ is Eular notation for the complex transcendental expression:

$$e^{-j\alpha} = -\cos\alpha + j\sin\alpha \qquad (4)$$

The polarization of the incident electric field vector E can then be determined by using a conventional network analyzer such as a Hewlett Packard HP8510 network analyzer.

At this time it should be noted that hybrid tees 83 and 87 in power combiner and divider circuit 80 may be replaced by conventional circulators. It should also be noted that the outputs of amplifiers 75 and 79 may be supplied to a conventional spectrum analyzer such as a Hewlett Packard 8562A Spectrum Analyzer to determine the frequency of the incident electromagnetic wave. In addition, an oscilloscope, 61, FIG. 1, may be connected to the outputs of amplifiers 75 and 79 and may be used to determine amplitude, phase, and frequency of the incident electromagnetic wave. It should further be noted that a load 89 is connected to the output port two of hybrid tee 87 allowing incoming power to be directed to output port four of hybrid tee 87.

From the foregoing, it may readily be seen that the subject invention comprises a new, unique and exceedingly useful photonic electromagnetic field sensor for use in a target seeking missile which constitutes a considerable improvement over the known prior art. Obviously many modifications and variations of the present invention are possible in light of the above teachings. It is therefore to be understood that within the scope of the above teachings the invention may be practiced otherwise than as specifically described.

What is claimed is:

1. An electromagnetic field sensor for use in a target seeking missile, said electromagnetic field sensor measuring the angle of arrival of incoming electromagnetic waves reflected from a target, said electromagnetic field sensor comprising:

a Luneberg lens having a front hemispherical portion and a rear hemispherical portion;

a radome affixed to the forward end of said target seeking missile;

a boresight for said electromagnetic field sensor, said boresight extending symmetrically through said radome and defining a forward direction;

said radome having a field of view, said field of view of said radome being defined by a first angle of about one hundred thirty five degrees in a clockwise direction from said boresight and a second angle of about one hundred thirty five degrees in a counterclockwise direction from said boresight, said radome receiving said electromagnetic waves reflected from said target which are within the field of view of said radome and then passing said received electromagnetic waves through said radome;

said Luneberg lens being mounted within said radome to intercept said electromagnetic waves passing through said radome;

a plurality of electro-optic crystals, each of said electro-optic crystals having first and second surfaces intersecting an optical path and a third surface;

said plurality of electro-optic crystals being positioned on and covering a substantial portion of the outer surface of the front hemispherical portion of said Luneberg lens and the entire outer surface of the rear hemispherical portion of said Luneberg lens, said Luneberg lens focusing each of said electromagnetic waves intercepted by said Luneberg lens on the third surface of one of said electro-optic crystals;

a light source for transmitting monochromatic light along said optical paths through each of said plurality of electro-optic crystals;

each of said electro-optic crystals upon which one of said electromagnetic waves is focused by said Luneberg lens modulating said monochromatic light as said monochromatic light traverses said electro-optic crystal;

each of said electro-optic crystals upon which one of said electromagnetic waves is focused by said Luneberg lens modulating the monochromatic light only when the frequency of said electromagnetic wave is within the microwave frequency range of the electromagnetic spectrum; and a plurality of detectors, each of said detectors being positioned along one of said optical paths downstream from one of said electro-optic crystals for detecting said modulated monochromatic light exiting from the second surface of said one electro-optic crystal;

each of said detectors, responsive to said modulated monochromatic light, providing an electrical signal indicative of the angle of arrival of said one electromagnetic wave focused by said Luneberg lens on said one electro-optic crystal.

2. The electromagnetic field sensor of claim 1 wherein each of said electro-optic crystals is fabricated from a second order nonlinear optical polymer.

3. The electromagnetic field sensor of claim 2 wherein said second order nonlinear optical polymer is polymethylmethacrylate.

4. The electromagnetic field sensor of claim 2 wherein said second order nonlinear optical polymer is methyl nitro aniline.

5. The electromagnetic field sensor of claim 1 wherein each of said detectors comprises:

a source of direct current voltage having an output;

a photodiode having an anode and a cathode, the cathode of said first photodiode being connected to the output of said direct current voltage source; and a low noise amplifier having an input connected to the anode of said first photodiode and an output, the output of said low noise amplifier providing said electrical signal indicative of the angle arrival of said electromagnetic wave reflected from said target.

6. The electromagnetic field sensor of claim 1 further comprising a radar absorbent material located within said missile and extending rearward of said Luneberg lens to a bulkhead within said missile, said radar absorbent material absorbing electromagnetic energy passing through said Luneberg lens.

7. The electromagnetic field sensor of claim 1 wherein said radome has an acutely pointed profile.

8. The electromagnetic field sensor of claim 1 further comprising:

a polarizer positioned along each of said optical paths between said light source and each of said electro-optic crystals for polarizing said monochromatic light transmitted from said light source into each of said electro-optic crystals through the first surface of each of said electro-optic crystals; and a plurality of first optical fibers, one of said plurality of first optical fibers being positioned along each of optical paths between said polarizer and said electro-optic crystals for maintaining the polarization of said monochromatic light as said monochromatic light is transmitted from said polarizer to said electro-optic crystal.

9. The electromagnetic field sensor of claim 1 further comprising a plurality of second optical fibers, one of said plurality of second optical fibers being positioned between along each of said optical paths between one of said electro-optic crystals and one of said detectors.

10. The electromagnetic field sensor apparatus of claim 1 wherein each of said electro-optic crystals is fabricated from a material selected from the group consisting of $LiNbO_3$, $LiTaO_3$, $KD_2PO_4(DKDP)$, $Ba_2NaNb_5O_{15}$, $Sr_{0.25}Ba_{0.75}Nb_2O_6$ and $BaTiO_3$.

11. An electromagnetic field sensor for use in a target seeking missile, said electromagnetic field sensor measuring the angle of arrival of an incoming electromagnetic wave reflected from a target, said electromagnetic field sensor comprising:

a Luneberg lens having a front hemispherical portion and a rear hemispherical portion, said Luneberg lens being positioned at the forward end of said target seeking missile;

a radome affixed to the forward end of said target seeking missile, the front hemispherical portion of said Luneberg lens being mounted within said radome;

a plurality of electro-optic crystals, each of said electro-optic crystals having first and second surfaces intersecting an optical path and a third surface;

said plurality of electro-optic crystals being positioned on and covering the entire outer surface of the rear hemispherical portion of said Luneberg lens to allow for the measurement of the angle of arrival of said electromagnetic wave reflected from said target;

a light source for transmitting monochromatic light along said optical paths through each of said plurality of electro-optic crystals;

a polarizer positioned along each of said optical paths between said light source and each of said electro-optic crystals for polarizing said monochromatic light transmitted from said light source into each of said electro-optic crystals through the first surface of each of said electro-optic crystals;

a plurality of first optical fibers, one of said plurality of first optical fibers being positioned along each of optical paths between said polarizer and said electro-optic crystals for maintaining the polarization of said monochromatic light as said monochromatic light is transmitted from said polarizer to said electro-optic crystal;

said radome passing said electromagnetic wave reflected from said target through said radome and providing said electromagnetic wave to the front hemispherical portion of said Luneberg lens;

said Luneberg lens focusing said electromagnetic wave upon the third surface of one of said plurality of electro-optic crystals;

said electro-optic crystal upon which said electromagnetic wave is focused by the front hemispherical portion of said Luneberg lens modulating said monochromatic light as said monochromatic light traverses said electro-optic crystal;

said electro-optic crystal upon which said electromagnetic wave is focused by said Luneberg lens modulating the monochromatic light only when the frequency of said electromagnetic wave is within the microwave frequency range of the electromagnetic spectrum;

a plurality of detectors, each of said detectors being position along one of said optical paths downstream from one of said electro-optic crystals, one of said detectors detecting modulated monochromatic light exiting from the second surface of said electro-optic crystal upon which said electromagnetic wave is focused by said Luneberg lens, said detector detecting said modulated monochromatic light providing an electrical signal indicative of the angle arrival of said electromagnetic wave reflected from said target; and a plurality of second optical fibers, one of said plurality of second optical fibers being positioned between along each of said optical paths between one of said electro-optic crystals and one of said detectors.

12. The electromagnetic field sensor of claim 11 wherein each of said electro-optic crystals is fabricated from a second order nonlinear optical polymer.

13. The electromagnetic field sensor of claim 12 wherein said second order nonlinear optical polymer is polymethylmethacrylate.

14. The electromagnetic field sensor of claim 12 wherein said second order nonlinear optical polymer is methyl nitro aniline.

15. The electromagnetic field sensor of claim 11 wherein each of said detectors comprises:

a source of direct current voltage having an output;

a photodiode having an anode and a cathode, the cathode of said first photodiode being connected to the output of said direct current voltage source; and a low noise amplifier having an input connected to the anode of said first photodiode and an output, the output of said low noise amplifier providing said electrical signal indicative of the angle arrival of said electromagnetic wave reflected from said target.

16. The electromagnetic field sensor of claim 11 further comprising a radar absorbent material located within said missile and extending rearward of said Luneberg lens to a bulkhead within said missile, said radar absorbent material absorbing electromagnetic energy passing through said Luneberg lens.

17. The electromagnetic field sensor of claim 11 wherein said electromagnetic wave reflected from said target has a frequency from eight gigahertz to twelve gigahertz.

18. The electromagnetic field sensor apparatus of claim 11 wherein each of said electro-optic crystals is fabricated from a material selected from the group consisting of $LiNbO_3$, $LiTaO_3$, $KD_2PO_4(DKDP)$, $Ba_2NaNb_5O_{15}$, $Sr_{0.25}Ba_{0.75}Nb_2O_6$ and $BaTiO_3$.

* * * * *